(12) United States Patent
Yamane et al.

(10) Patent No.: US 7,262,627 B2
(45) Date of Patent: Aug. 28, 2007

(54) MEASURING APPARATUS, MEASURING METHOD, AND TEST APPARATUS

(75) Inventors: Tomoyuki Yamane, Tokyo (JP); Hirokatsu Niijima, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/497,506

(22) Filed: Aug. 1, 2006

(65) Prior Publication Data
US 2007/0096762 A1    May 3, 2007

Related U.S. Application Data

(63) Continuation of application No. PCT/JP05/01497, filed on Feb. 2, 2005.

(30) Foreign Application Priority Data
Feb. 5, 2004    (JP)    ............... 2004-029751

(51) Int. Cl.
*G01R 31/26* (2006.01)
(52) U.S. Cl. .................... 324/765; 324/121 R
(58) Field of Classification Search ............ 324/76.19, 324/121 R, 158.1, 163–765; 714/704–706; 702/66–67, 124
See application file for complete search history.

(56) References Cited

U.S. PATENT DOCUMENTS 6,016,565 A * 1/2000 Miura ................... 714/736
6,479,983 B1 * 11/2002 Ebiya .................. 324/158.1
6,865,698 B2 * 3/2005 Housako ................ 714/700
7,196,534 B2 * 3/2007 Oshima ................. 324/765
2001/0052097 A1 * 12/2001 Miura ................... 714/744
2004/0122620 A1 * 6/2004 Doi et al. .............. 702/182

FOREIGN PATENT DOCUMENTS

JP          53-102784      9/1978
WO    WO-02/103379 A1   12/2002

OTHER PUBLICATIONS

International Search Report issued in International application No. PCT/JP2005/001497 mailed on May 17, 2005 and English translation thereof, 2 pages.

* cited by examiner

*Primary Examiner*—Ha Tran Nguyen
*Assistant Examiner*—Joshua Benitez
(74) *Attorney, Agent, or Firm*—Osha Liang LLP

(57) ABSTRACT

There is provided a measuring apparatus that generates a first strobe signal and a second strobe signal in synchronization with an output signal, sequentially changes phases of the strobe signals whenever the electronic device outputs the output signal multiple times, acquires a signal level of the output signal at each phase of the strobe signals by the multiple times, counts the number of times by which the signal level of the output signal to the first strobe signal is a High level for each phase of the first strobe signal, counts the number of times by which the signal level of the output signal to the second strobe signal is a Low level for each phase of the second strobe signal, and computes a phase of a variation point of a waveform of the output signal, a jitter amount, and distribution of jitter based on the counted number of times. The measuring apparatus measures a variation point of a waveform of the output signal, a jitter amount, and distribution of jitter by one-time test.

13 Claims, 5 Drawing Sheets

MEASURING APPARATUS, MEASURING METHOD, AND TEST APPARATUS

CROSS REFERENCE TO RELATED APPLICATION

This is a continuation application of PCT/JP2005/001497 filed on Feb. 2, 2005 which claims priority from a Japanese Patent application No. 2004-029751 filed on Feb. 5, 2004, the contents of which are incorporated herein by reference.

BACKGROUND OF THE INVENTION

1. Field of the Invention

The present invention relates to a measuring apparatus' a measuring method, and a test apparatus for measuring a waveform of an output signal output from an electronic device such as a semiconductor device.

2. Related Art

There has been conventionally used a measuring apparatus for measuring a waveform of an output signal from an electronic device such as a semiconductor device in order to decide the good or bad of the electronic device. The measurement of a waveform of an output signal includes, for example, measurement of jitter of the output signal and measurement of a variation point of the waveform of the output signal.

A conventional measuring apparatus' for example when measuring jitter, continuously outputs an output signal to an electronic device multiple times detects a signal level of each output signal at a predetermined phase, and compares the detected signal level and a predetermined signal level. Then, the measuring apparatus sequentially changes a phase detecting a signal level and obtain the number of times by which a comparison result is a pass (or a fail) for each phase, in order to measure jitter of the output signal. In this case, the measuring apparatus generates a strobe signal to determine a phase detecting a signal level of an output signal and sequentially changes a phase of this strobe signal, in order to perform measurement.

Moreover, when measuring a variation point of a waveform of an output signal, a conventional measuring apparatus continuously outputs an output signal to an electronic device multiple times changes a phase of a strobe signal for each output signal, and detects a phase, at which a comparison result varies from a pass to a fail (or from a fail to a pass), as a variation point of a waveform.

Moreover, as a measuring apparatus for measuring jitter, a measuring apparatus using two strobe signals of which a phase interval is determined is known as disclosed, for example, in Patent Document 1. This measuring apparatus measures jitter distribution of an output signal by scanning the output signal with two strobe signals having a constant phase interval.

Patent Document 1 WO02-50557

However, since a conventional measuring apparatus must separately measure a jitter amount of an output signal and a variation point of a waveform of the output signal, measurement was inefficient. Moreover, a measuring apparatus using two strobe signals measures only distribution of jitter, and thus cannot measure a variation point of a waveform of an output signal and sharpness of an edge of the output signal. Moreover, it is necessary to determine a phase interval of two strobe signals to an appropriate value. For this reason, it is necessary to repeatedly perform measurement in order to determine this phase interval, and thus measurement efficiency deteriorates.

SUMMARY OF THE INVENTION

Therefore, it is an object of the present invention to provide a measuring apparatus a measuring method, and a test apparatus that can solve the foregoing problems. The above and other objects can be achieved by combinations described in the independent claims. The dependent claims define further advantageous and exemplary combinations of the present invention.

To solve this problem, according to the first aspect of the present invention, there is provided a measuring apparatus that measures a waveform of an output signal output from an electronic device. The measuring apparatus includes: a strobe generating section that generates a first strobe signal and a second strobe signal having a phase different from that of the first strobe signal in synchronization with the output signal; a strobe shifting section that sequentially changes a phase of the first strobe signal and a phase of the second strobe signal whenever the electronic device outputs the output signal multiple times; a first timing comparing section that acquires a signal level of the output signal at each phase of the first strobe signal by the multiple times; a second timing comparing section that acquires a signal level of the output signal at each phase of the second strobe signal by the multiple times; a first counter that counts the number of times by which the signal level of each output signal acquired by the first timing comparing section is a High level for each phase of the first strobe signal; a second counter that counts the number of times by which the signal level of each output signal acquired by the second timing comparing section is a Low level for each phase of the second strobe signal; and a fail memory that stores the number of times counted by the first counter and the number of times counted by the second counter.

The measuring apparatus may further include an arithmetic section that computes a phase of a variation point of a waveform of the output signal, a jitter amount, and distribution of jitter based on the number of times counted by the first counter for each phase and the number of times counted by the second counter for each phase.

The strobe shifting section may sequentially change a phase of the first strobe signal and a phase of the second strobe signal so that a relative phase between the first strobe signal and the second strobe signal is changed.

The strobe shifting section may sequentially change a phase of the first strobe signal from one end of a phase range including a phase of a variation point of a waveform of the output signal toward the other end of the phase range, and sequentially change a phase of the second strobe signal from the other end of the phase range toward one end of the phase range.

The strobe shifting section may sequentially change a phase of the first strobe signal and a phase of the second strobe signal with the generally same change amount.

The strobe shifting section may stop the change of phases of the first strobe signal and the second strobe signal when the number of times by which the signal level of the output signal sequentially counted at each phase of the first strobe signal is not a High level is equal to the multiple times and the number of times by which the signal level of the output signal sequentially counted at each phase of the second strobe signal is not a Low level is equal to the multiple times.

The measuring apparatus may further include a measuring apparatus controlling section that stores values counted by the first counter and the second counter on the fail memory in association with the phase of the first strobe and the phase of the second strobe and resets the values counted by the first counter and the second counter, whenever the electronic device outputs the output signal by the multiple times.

According to the second aspect of the present invention, there is provided a measuring method for measuring a waveform of an output signal output from an electronic device. The measuring method includes: a strobe generating step of generating a first strobe signal and a second strobe signal having a phase different from that of the first strobe signal in synchronization with the output signal; a strobe shifting step of sequentially changing a phase of the first strobe signal and a phase of the second strobe signal whenever the electronic device outputs the output signal multiple times; a first timing comparing step of acquiring a signal level of the output signal at each phase of the first strobe signal by the multiple times; a second timing comparing step of acquiring a signal level of the output signal at each phase of the second strobe signal by the multiple times; a first counting step of counting the number of times by which the signal level of each output signal acquired in the first timing comparing step is a High level for each phase of the first strobe signal; a second counting step of counting the number of times by which the signal level of each output signal acquired in the second timing comparing step is a Low level for each phase of the second strobe signal; and a storing step of storing the number of times counted in the first counting step and the number of times counted in the second counting step.

The measuring method may further include an arithmetic step of computing a phase of a variation point of a waveform of the output signal, a jitter amount, and distribution of jitter based on the number of times counted in the first counting step for each phase and the number of times counted in the second counting step for each phase.

The strobe shifting step may include sequentially changing a phase of the first strobe signal and a phase of the second strobe signal so that a relative phase between the first strobe signal and the second strobe signal is changed.

The strobe shifting step may include: sequentially changing a phase of the first strobe signal from one end of a phase range including a phase of a variation point of a waveform of the output signal toward the other end of the phase range; and sequentially changing a phase of the second strobe signal from the other end of the phase range toward one end of the phase range. The strobe shifting step may include sequentially changing a phase of the first strobe signal and a phase of the second strobe signal with the generally same change amount.

According to the third aspect of the present invention, there is provided a test apparatus that tests an electronic device. The test apparatus includes: a control section that generates a test signal for testing the electronic device and supplies the test signal to the electronic device; and a measuring apparatus that measures a waveform of an output signal from the electronic device and decides the good or bad of the electronic device. The measuring apparatus includes: a strobe generating section that generates a first strobe signal and a second strobe signal having a phase different from that of the first strobe signal in synchronization with the output signal; a strobe shifting section that sequentially changes a phase of the first strobe signal and a phase of the second strobe signal whenever the electronic device outputs the output signal multiple times; a first timing comparing section that acquires a signal level of the output signal at each phase of the first strobe signal by the multiple times; a second timing comparing section that acquires a signal level of the output signal at each phase of the second strobe signal by the multiple times; a first counter that counts the number of times by which the signal level of each output signal acquired by the first timing comparing section is a High level for each phase of the first strobe signal; a second counter that counts the number of times by which the signal level of each output signal acquired by the second timing comparing section is a Low level for each phase of the second strobe signal; a fail memory that stores the number of times counted by the first counter and the number of times counted by the second counter; and an arithmetic section that computes a phase of a variation point of a waveform of the output signal, a jitter amount, and distribution of jitter and decides the good or bad of the electronic device based on the number of times counted by the first counter for each phase and the number of times counted by the second counter for each phase.

The summary of the invention does not necessarily describe all necessary features of the present invention. The present invention may also be a sub-combination of the features described above.

BRIEF DESCRIPTION OF THE DRAWINGS

FIG. 3A shows the number of times by which a signal level of an output signal is not a High level (a fail) at each phase of a first strobe signal, and FIG. 3B shows the number of times by which a signal level of an output signal is not a Low level (a fail) at each phase of a second strobe signal.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
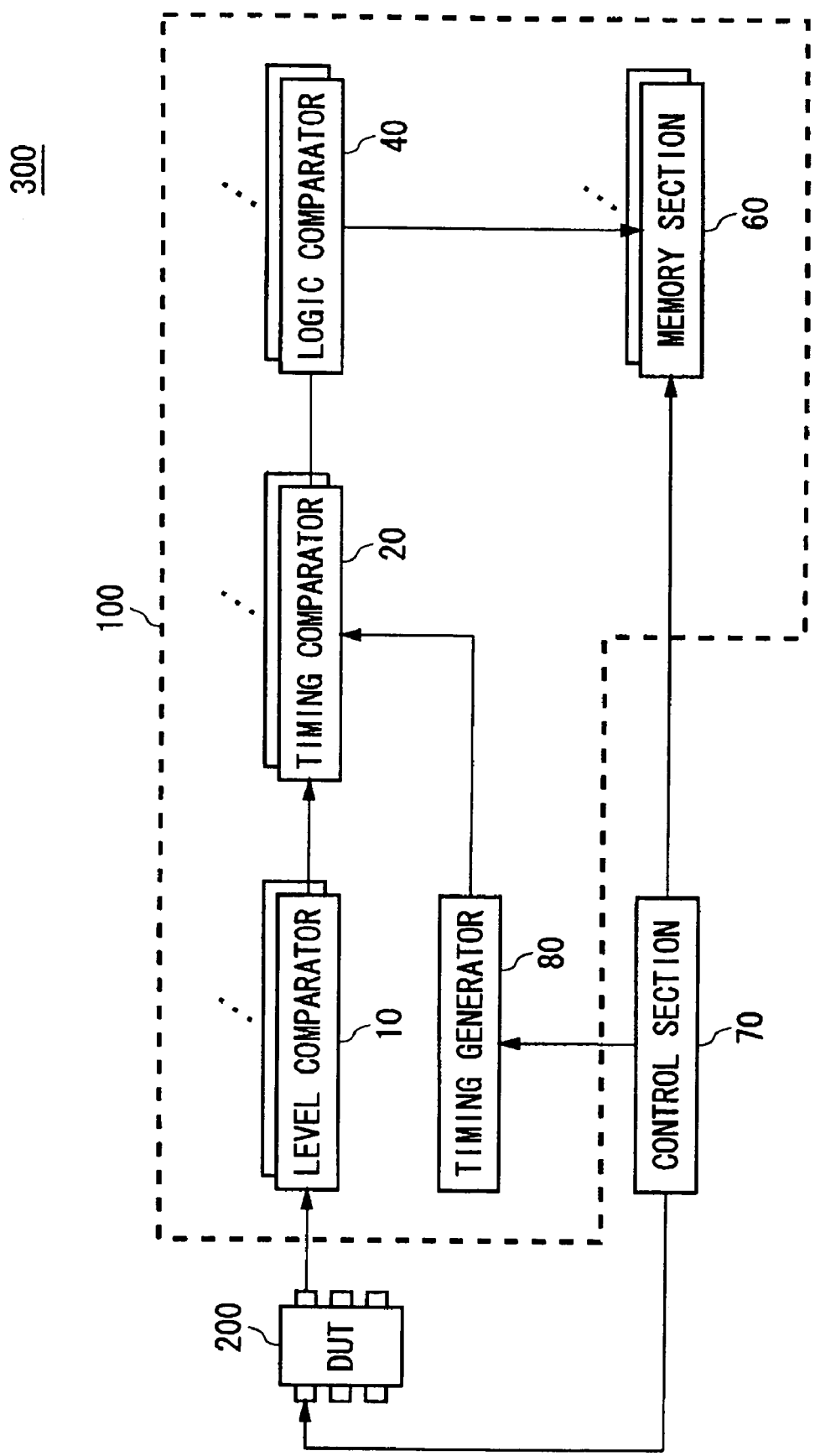
FIG. 1 is a view exemplary showing a configuration of a test apparatus according to an embodiment of the present invention.

FIG. 1 is a view exemplary showing a configuration of a test apparatus 300 according to an embodiment of the present invention. The test apparatus 300 is an apparatus that decides the good or bad of an electronic device 200 such as a semiconductor device, and includes a control section 70 and a measuring apparatus 100. The control section 70 supplies a test signal to the electronic device 200 and controls the measuring apparatus 100. A test signal is a signal operating the electronic device 200 and making the electronic device 200 output an output signal. The measuring apparatus 100 is a measuring apparatus for measuring a waveform of an output signal output from the electronic device 200 such as a semiconductor device, and includes a level comparator 10, a timing comparator 20, a logic comparator 40, a memory section 60, and a timing generator 80. A plurality of level comparators 10, a plurality of timing comparators 20, a plurality of logic comparators 40, and a plurality of memory sections 60 are respectively provided corresponding to a plurality of pins of the electronic device 200.

The level comparator 10 receives an output signal output from the electronic device 200, and outputs a comparison result obtained by comparing a voltage level of the received output signal and a previously given voltage level. For example, the level comparator 10 outputs a digital signal having High logic when a voltage level of an output signal is larger than a given voltage level and Low logic when a voltage level of an output signal is smaller than a given voltage level.

The timing comparator 20 acquires a value of a digital signal given from the level comparator 10 at a timing of a strobe signal given from the timing generator 80. The timing generator 80 generates a strobe signal according to a signal given from the control section 70, and supplies the strobe signal to the timing comparator 20. Detailed configurations of the level comparator 10, the timing comparator 20, and the timing generator 80 will be below described with reference to FIG. 4.

The logic comparator 40 compares the value acquired by the timing comparator 20 and an expectation signal given from the control section 70, and supplies a comparison result to the memory section 60. Then, when the memory section 60 receives an instruction related to the storage of the comparison result from the control section 70, the memory section 60 stores the comparison result by the logic comparator 40. The control section 70 may further function as a pattern generator for generating a test pattern and a waveform shaper for generating a test signal based on the test pattern and supplying the test signal to the electronic device 200. Detailed configurations of the logic comparator 40, the memory section 60, and the control section 70 will be below described with reference to FIG. 5.

Figure 2:
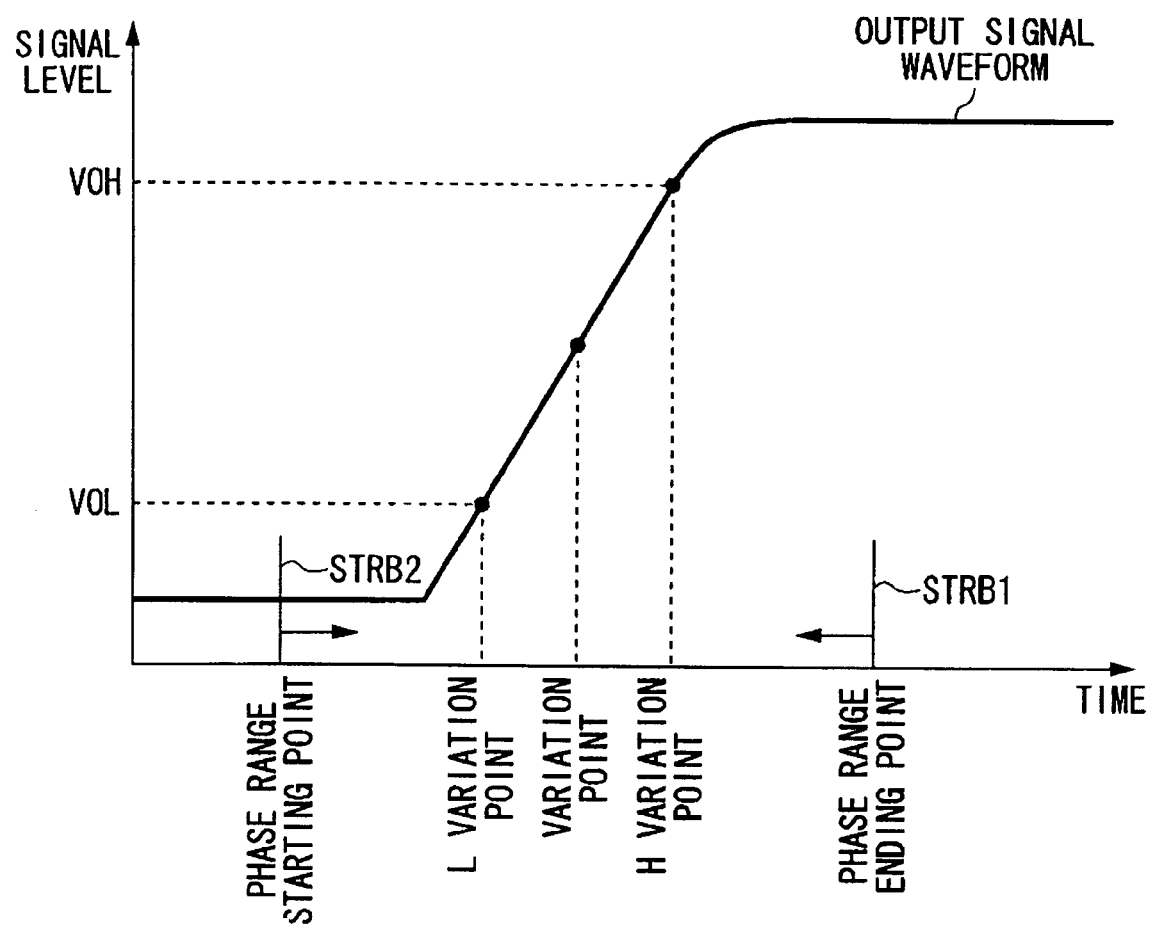
FIG. 2 is a view exemplary showing an output signal output from an electronic device.

FIG. 2 is a view exemplary showing an output signal output from the electronic device 200. In FIG. 2, a vertical axis shows a voltage level and a horizontal axis shows a time. First, the timing generator 80 generates a first strobe signal (STRB1) and a second strobe signal (STRB2) having a phase different from that of the first strobe signal in synchronization with an output signal. At this time, the timing generator 80 generates the first strobe signal at a phase of an ending point of a phase range including a variation point of a waveform of the output signal and generates the second strobe signal at a phase of a starting point of the phase range. A phase range including a variation point of a waveform of an output signal can be easily determined based on a characteristic or the like of the electronic device 200.

Moreover, while the electronic device 200 outputs an output signal by predetermined multiple times the timing generator 80 outputs the first strobe signal and the second strobe signal in synchronization with the output signal without changing a relative phase to the output signal. Then, the timing comparator 20 respectively acquires values at timings of the first strobe signal and the second strobe signal, of the output signal output multiple times.

Moreover, whenever the electronic device 200 outputs the output signal multiple times the timing generator 80 sequentially changes a phase of the first strobe signal and a phase of the second strobe signal. In the present example, the timing generator 80 sequentially changes the phase of the first strobe signal from the ending point of the phase range toward the starting point of the phase range, and sequentially changes the phase of the second strobe signal from the starting point of the phase range toward the ending point of the phase range. Here, it is preferable that the timing generator 80 sequentially changes the phase of the first strobe signal and the phase of the second strobe signal with the same change amount. Then, the timing comparator 20 acquires the value of the output signal at each phase of each strobe signal multiple times.

The logic comparator 40 decides whether the value of the output signal acquired multiple times at each phase of the first strobe signal is a High level larger than a comparative voltage VOH. Moreover, the logic comparator 40 decides whether the value of the output signal acquired multiple times at each phase of the second strobe signal is a Low level smaller than a comparative voltage VOL.

Then, the memory section 60 counts the number of times by which a signal level of the output signal is a High level at each phase of the first strobe signal, counts the number of times by which a signal level of the output signal is a Low level at each phase of the second strobe signal, and stores each in association with a phase of each strobe signal. Moreover, in another example, the memory section 60 may count the number of times by which the signal level of the output signal is not a High level at each phase of the first strobe signal, count the number of times by which the signal level of the output signal is not a Low level at each phase of the second strobe signal, and store each in association with a phase of each strobe signal.

Figure 3A:
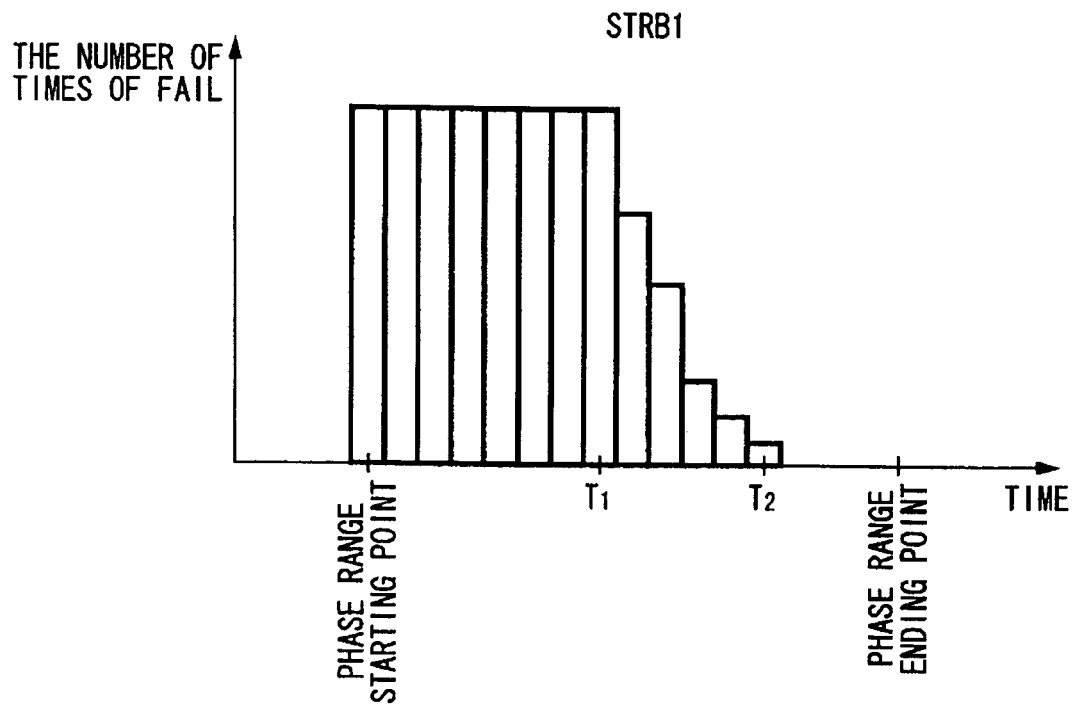
FIGS. 3A and 3B are views exemplary showing a counted result in a memory section.
Figure 3B:
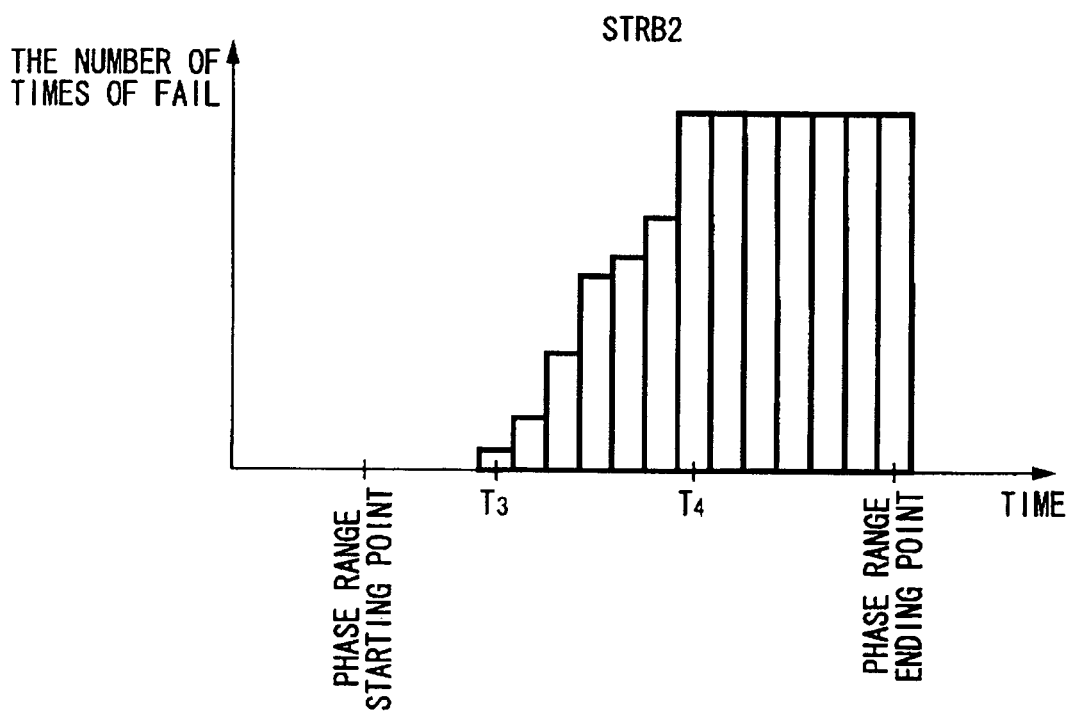

FIGS. 3A and 3B are views exemplary showing a counted result in the memory section 60. FIG. 3A shows the number of times by which the signal level of the output signal is not a High level (a fail) at each phase of the first strobe signal, and FIG. 3B shows the number of times by which the signal level of the output signal is not a Low level (a fail) at each phase of the second strobe signal.

When measuring a waveform of a rising edge as shown in FIG. 2, fails begin to be counted at a certain phase $T_2$ of the first strobe signal as shown in FIG. 3A when the first strobe signal is measured by a sequential phase shift from an ending point of a phase range to a starting point of the phase range. In other words the phase $T_2$ shows a phase of an H variation point when the output signal delays at a maximum due to jitter. Then, as the phase of the first strobe signal approaches the starting point of the phase range, the number of times of fails increases according to distribution of jitter. Then, although a phase advances at a maximum due to jitter, all values of the output signal acquired multiple times at a phase $T_1$, at which the value of the output signal is not a pass become a fail.

Moreover, when the second strobe signal is similarly measured by a sequential phase shift from the starting point of the phase range to the ending point of the phase range, fails begin to be counted at a certain phase $T_3$ of the second strobe signal as shown in FIG. 3B. Then, as the phase of the second strobe signal approaches the ending point of the phase range, the number of times of fails increases and all values of the output signal acquired multiple times at a certain phase $T_3$ become a fail.

The measuring apparatus 100 in the present example computes a phase of a variation point of an output signal, a jitter amount, and distribution of jitter based on a measurement result as shown in FIG. 3A and FIG. 3B. For example, a jitter amount of an output signal can be computed by means of a difference between a phase $T_2$ delayed at a maximum by jitter and a phase $T_3$ advanced at a maximum by jitter. Moreover, distribution of jitter can be obtained from distribution of the number of times shown in FIG. 3A and FIG. 3B. Moreover, the measuring apparatus 100 may detect the phase $T_2$ of the first strobe signal for which fails begin to be counted as a variation point of a High level of an output signal, or may detect the phase $T_3$ of the second strobe signal for which fails begin to be counted as a variation point of a Low level of an output signal. Moreover, a middle point between the phase $T_2$ and the phase $T_3$ may be detected as a variation point of an output signal. According to the measuring apparatus 100 in the present example, it is possible to measure a jitter amount of an output signal, distribution of jitter, and a phase of a variation point by one-time measurement. Moreover, since a pass-fail for a comparative voltage VOH and a pass-fail for a comparative voltage VOL can be simultaneously measured by means of two strobe signals' it is possible to further efficiently perform measurement.

Moreover, although the present example has described measurement of a rising edge of an output signal, a falling edge of an output signal can be measured by a similar operation. For example, when measuring a falling edge of an output signal, the timing generator 80 sequentially changes a phase of the first strobe signal from a starting point of a phase range toward an ending point of the phase range and sequentially changes a phase of the second strobe signal from the ending point of the phase range toward the starting point of the phase range, in order to measures the falling edge. Moreover, although the timing generator 80 sequentially changes a phase of the first strobe signal from the ending point of the phase range toward the starting point of the phase range and sequentially changes a phase of the second strobe signal from the starting point of the phase range toward the ending point of the phase range in order to measure the falling edge, the logic comparator 40 can decide whether a value of the output signal acquired multiple times at each phase of the first strobe signal is a Low level smaller than the comparative voltage VOL and decide whether a value of the output signal acquired multiple times at each phase of the second strobe signal is a High level larger than the comparative voltage VOH, in order to similarly measure the falling edge.

Figure 4:
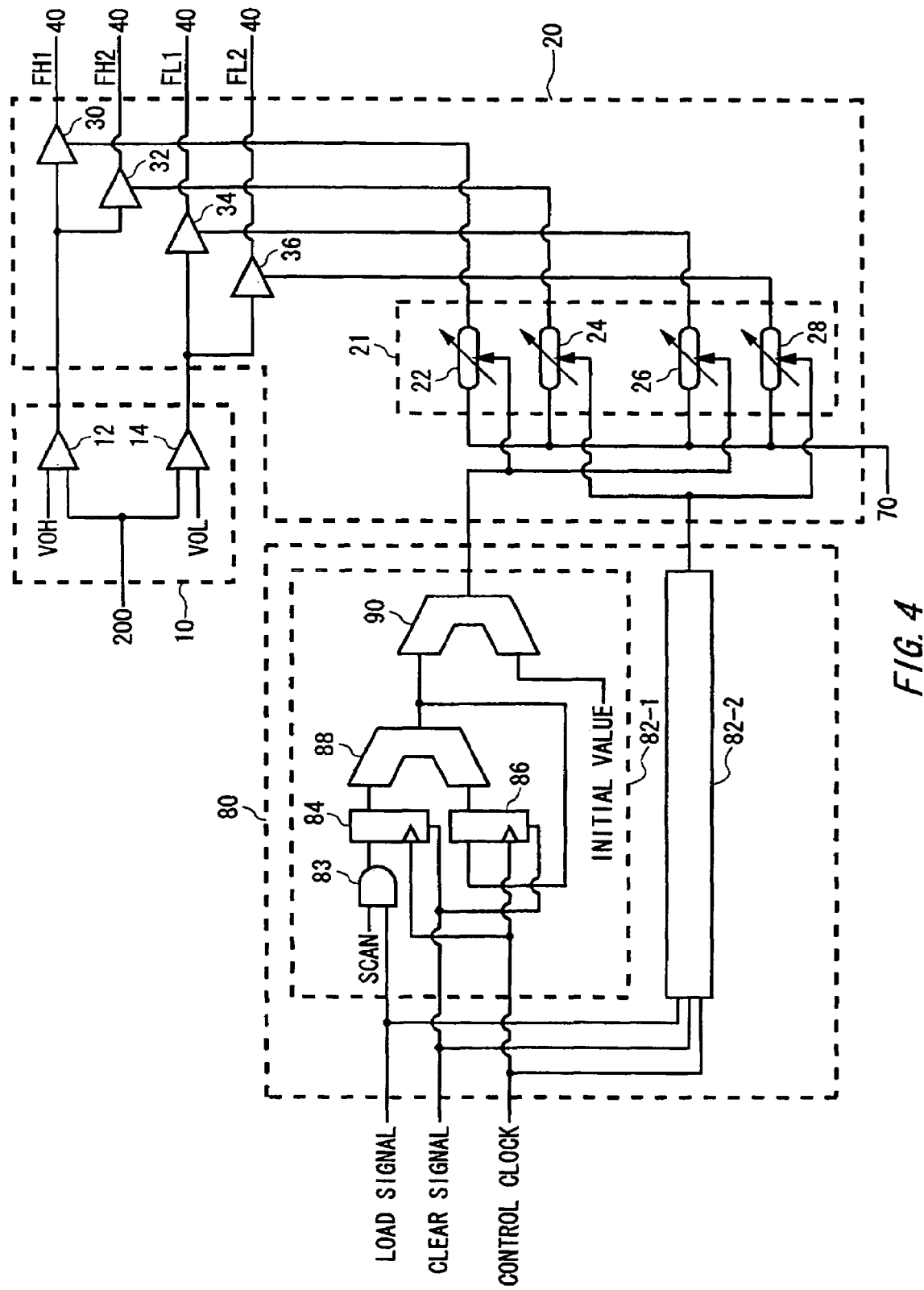
FIG. 4 is a view exemplary showing a configuration of a level comparator, a timing comparator, and a timing generator.

FIG. 4 is a view exemplary showing a configuration of the level comparator 10, the timing comparator 20, and the timing generator 80. The level comparator 10 has a comparator 12 and a comparator 14.

The comparator 12 receives an output signal from the electronic device 200 and the predetermined comparative voltage VOH, and converts the output signal into a digital signal to output it. In the present example, the comparator 12 outputs a digital signal, that becomes a pass (Low logic) when a voltage level of the output signal is not less than the comparative voltage VOH and becomes a fail (High logic) when a voltage level of the output signal is smaller than the comparative voltage VOH. Moreover, the comparator 14 receives an output signal from the electronic device 200 and the predetermined comparative voltage VOL, and converts the output signal into a digital signal to output it. In the present example, the comparator 12 outputs a digital signal that becomes a pass (Low logic) when a voltage level of the output signal is not more than the comparative voltage VOL and becomes a fail (High logic) when a voltage level of the output signal is larger than the comparative voltage VOL.

The timing generator 80 has a first strobe shifting section 82-1 for shifting a phase of the first strobe signal and a second strobe shifting section 82-2 for shifting a phase of the second strobe signal. The first strobe shifting section 82-1 has an AND circuit 83, a flip-flop 84, a flip-flop 86, an adder 88, and an adder 90. In the present example, the first strobe shifting section 82-1 and the second strobe shifting section 82-2 generate a phase signal for controlling a phase of a strobe signal.

The AND circuit 83 controls whether SCAN data are supplied to the flip-flop 84 according to a load signal provided from the control section 70. Here, the SCAN data given to the AND circuit 83 are data showing phase shift resolution of the first strobe signal. The flip-flop 84 is supplied with the SCAN data via the AND circuit 83, and supplies the SCAN data to the adder 88 when a load signal is input according to a control clock given from the control section 70. Here, the control clock is a clock synchronized with an output signal output from the electronic device 200.

The flip-flop 86 is supplied with data output from the adder 88, and supplies the received data to the adder 88 according to the control clock given from the control section 70. The adder 88 outputs data obtained by adding the SCAN data received from the flip-flop 84 and the data received from the flip-flop 86 to the adder 90. Moreover, the flip-flop 84 and the flip-flop 86 are supplied with a clear signal for initializing the stored values from the control section 70. Here, the load signal and the clear signal are given in synchronization with the control clock at a timing described on a pattern program.

Then, the adder 90 is supplied with a first initial value showing an initial phase of the first strobe signal, and outputs data obtained by adding the data received from the adder 88 to the first initial value. In other words the first strobe shifting section 82-1 outputs a phase signal of which a signal value is sequentially increased by a value of the SCAN data from the first given initial value whenever the control section 70 inputs the load signal. Moreover, the first strobe shifting section 82-1 may have a subtracter in place of the adder 90. In this case, the first strobe shifting section 82-1 outputs a phase signal of which a signal value is sequentially decreased by a value of the SCAN data from the first given initial value whenever the control section 70 inputs the load signal.

Moreover, the second strobe shifting section 82-2 has the same configuration as that of the first strobe shifting section 82-1 previously described, and is supplied with the same SCAN data and a second initial value different from the first initial value. Moreover, as described in FIG. 2 and FIGS. 3A and 3B, the first strobe shifting section 82-1 and the second strobe shifting section 82-2 sequentially change a phase of the first strobe signal and a phase of the second strobe signal so that a relative phase between the first strobe signal and the second strobe signal is changed.

In the present example, the first strobe shifting section 82-1 is supplied with the first initial value based on the ending point of the phase range described in FIG. 2 and FIGS. 3A and 3B, and the second strobe shifting section 82-2 is supplied with the second initial value based on the starting point of the phase range. Then, whenever the control section 70 inputs the load signal, the first strobe shifting section 82-1 outputs a phase signal of which a signal value is sequentially decreased by a value of the SCAN data from the first initial value based on the ending point of the phase range, and the second strobe shifting section 82-2 outputs a phase signal of which a signal value is sequentially increased by a value of the SCAN data from the second initial value based on the starting point of the phase range.

Moreover, the first strobe shifting section 82-1 and the second strobe shifting section 82-2 may stop the change of phases of the first strobe signal and the second strobe signal and terminate measurement of a waveform when the number of times by which the signal level of the output signal sequentially counted at each phase of the first strobe signal is not a High level is equal to the multiple times and the number of times by which the signal level of the output signal sequentially counted at each phase of the second strobe signal is not a Low level is equal to the multiple times. It is possible to efficiently perform measurement by this control.

The timing comparator 20 has a plurality of timing comparators (30, 32, 34, and 36) and a strobe generating section 21. Moreover, the strobe generating section 21 has a plurality of variable delay circuits (22, 24, 26, and 28). Each variable delay circuit (22, 24, 26, and 28) is supplied with a reference clock synchronized with the output signal output from the electronic device 200 multiple times' and delays the reference clock to generate a strobe signal.

The variable delay circuit 22 and the variable delay circuit 26 are supplied with a phase signal output from the first strobe shifting section 82-1 as a delay setting, and delay and output the reference clock by a delay amount according to the phase signal. That is to say, the variable delay circuit 22 and the variable delay circuit 26 output the first strobe signal. Moreover, the variable delay circuit 24 and the variable delay circuit 28 are supplied with a phase signal output from the second strobe shifting section 82-2 as a delay setting, and delay and output the reference clock by a delay amount according to the phase signal. That is to say, the variable delay circuit 24 and the variable delay circuit 28 output the second strobe signal.

The timing comparator 30 receives a pass or fail signal output from the comparator 12 at a timing of the first strobe signal provided from the variable delay circuit 22. In other words the timing comparator 30 acquires a signal level of an output signal at the phase of the first strobe signal as a pass or a fail for the comparative voltage VOH. In the present example, the timing comparator 30 functions as a first timing comparing section that acquires a signal level of an output signal at each phase of the first strobe signal multiple times.

The timing comparator 34 receives a pass or fail signal output from the comparator 14 at a timing of the first strobe signal. In other words the timing comparator 34 acquires a signal level of an output signal at a phase of the first strobe signal as a pass or a fail for the comparative voltage VOL.

The timing comparator 32 receives a pass or fail signal output from the comparator 12 at a timing of the second strobe signal provided from the variable delay circuit 24. In other words the timing comparator 32 acquires a signal level of an output signal at a phase of the second strobe signal as a pass or a fail for the comparative voltage VOH.

The timing comparator 36 receives a pass or fail signal output from the comparator 14 at a timing of the second strobe signal. In other words the timing comparator 36 acquires a signal level of an output signal at a phase of the second strobe signal as a pass or a fail for the comparative voltage VOL. In the present example, the timing comparator 36 functions as a second timing comparing section that acquires a signal level of an output signal at each phase of the second strobe signal multiple times.

Figure 5:
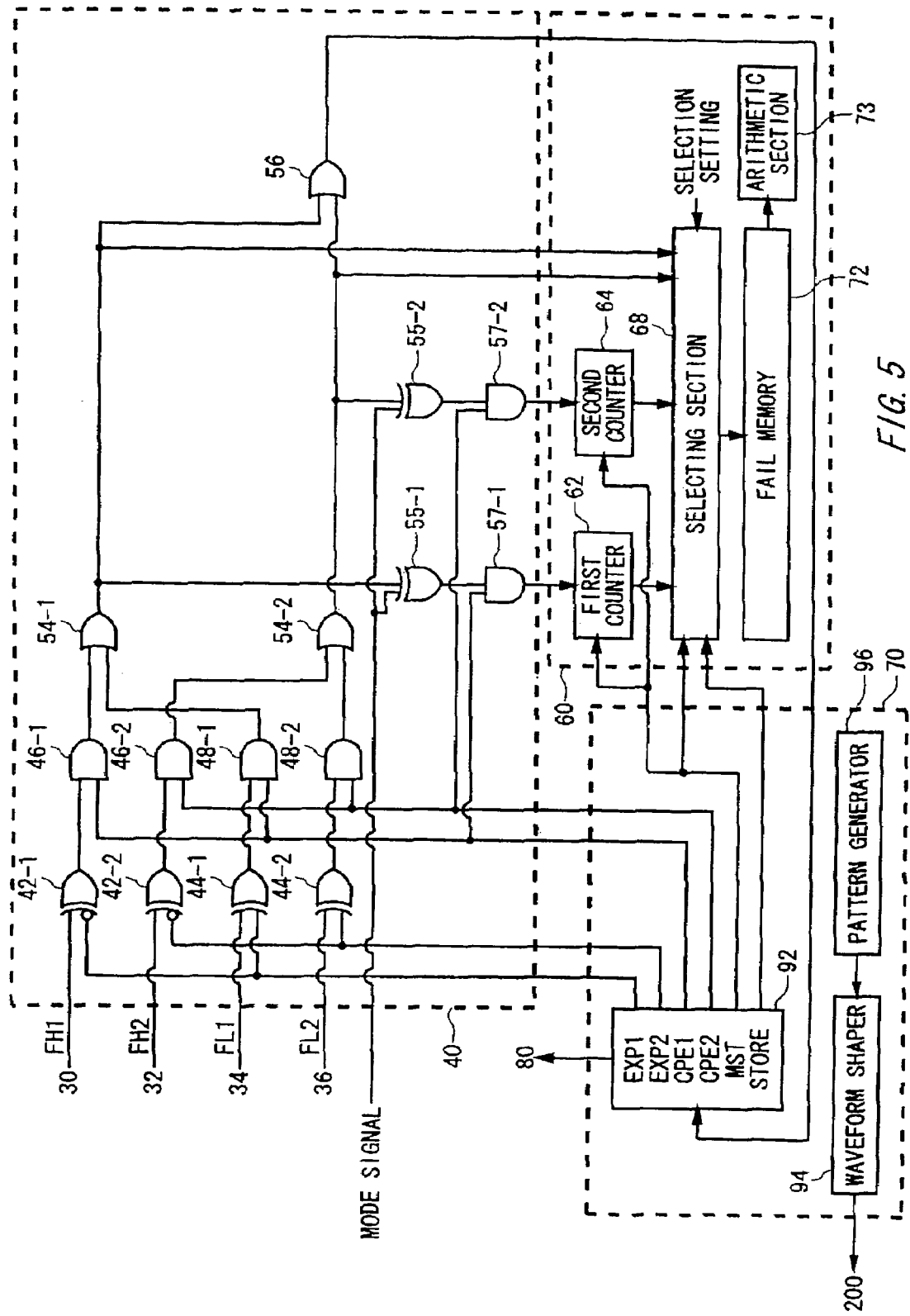
FIG. 5 is a view exemplary showing a configuration of a logic comparator, a memory section, and a control section.

FIG. 5 is a view exemplary showing a configuration of the logic comparator 40, the memory section 60, and the control section 70. The logic comparator 40 has a plurality of exclusive OR circuits (42-1, 42-2, 44-1, 44-2, 55-1, and 55-2), a plurality of AND circuits (46-1, 46-2, 48-1, 48-2, 57-1, and 57-2), a plurality of OR circuits (54-1 and 54-2), and an OR circuit 56. Moreover, the memory section 60 has a first counter 62, a second counter 64, a selecting section 68, a fail memory 72, and an arithmetic section 73. Moreover, the control section 70 has a measuring apparatus controlling section 92, a waveform shaper 94, and a pattern generator 96. The measuring apparatus controlling section 92 controls the measuring apparatus 100 as described in FIGS. 1 to 4. Moreover, the pattern generator 96 generates a test pattern for testing the electronic device 200, and the waveform shaper 94 generates a test signal based on the test pattern to supply it to the electronic device 200. The test pattern is a digital signal shown by, e.g., a pattern of one or zero. Moreover, the test signal is a signal of which a voltage level changes according to a value of the digital signal, and makes the electronic device 200 output an output signal.

The exclusive OR circuit 42-1 outputs an exclusive OR of the signal received from the timing comparator 30 and an inverted signal of an expectation signal (EXP1) provided from the measuring apparatus controlling section 92. In other words the exclusive OR circuit 42-1 outputs a pass (Low logic) when a signal level of an output signal at a phase of the first strobe signal is identical with the expectation signal EXP1. Here, the measuring apparatus controlling section 92 outputs an expected value of the signal level of the output signal at the phase of the first strobe signal as the expectation signal EXP1. For example, in an example of FIG. 4, the measuring apparatus controlling section 92 outputs High logic as the expectation signal EXP1. Moreover, the exclusive OR circuit 44-1 outputs an exclusive OR of the signal received from the timing comparator 34 and the expectation signal (EXP1) provided from the measuring apparatus controlling section 92.

Moreover, the exclusive OR circuit 42-2 outputs an exclusive OR of the signal received from the timing comparator 32 and an inverted signal of an expectation signal (EXP2) provided from the measuring apparatus controlling section 92. In other words' the exclusive OR circuit 42-2 outputs a pass (Low logic) when a signal level of an output signal at a phase of the second strobe signal is identical with the expectation signal EXP2. Here, the measuring apparatus controlling section 92 outputs an expected value of the signal level of the output signal at the phase of the second strobe signal as the expectation signal EXP2. For example, in an example of FIG. 2, the measuring apparatus controlling section 92 outputs Low logic as the expectation signal EXP2. Moreover, the exclusive OR circuit 44-2 outputs an exclusive OR of the signal received from the timing comparator 36 and the expectation signal (EXP2) provided from the measuring apparatus controlling section 92.

Then, the AND circuit 46-1 outputs a logical product of the signal output from the exclusive OR circuit 42-1 and a control signal (CPE1) provided from the measuring apparatus controlling section 92. In other words' when the control signal CPE1 is High logic, the AND circuit 46-1 passes through a pass or fail signal output from the exclusive OR circuit 42-1. Moreover, the AND circuit 48-1 output a logical product of the signal output from the exclusive OR circuit 44-1 and the control signal (CPE1) provided from the measuring apparatus controlling section 92. In other words' when the control signal CPE1 is High logic, the AND circuit 48-1 passes through a pass or fail signal output from the exclusive OR circuit 44-1. Here, when measuring a waveform of the output signal, the measuring apparatus controlling section 92 outputs High logic as the control signal CPE1.

Moreover, the AND circuit 46-2 outputs a logical product of the signal output from the exclusive OR circuit 42-2 and a control signal (CPE2) provided from the measuring apparatus controlling section 92. Moreover, the AND circuit 48-2 outputs a logical product of the signal output from the exclusive OR circuit 44-2 and the control signal (CPE2) provided from the measuring apparatus controlling section 92. Here, when measuring a waveform of the output signal, the measuring apparatus controlling section 92 outputs High logic as the control signal CPE2.

Then, the OR circuit 54-1 outputs a logical sum of a pass or fail signal output from the AND circuit 46-1 and a pass or fail signal output from the AND circuit 48-1. Moreover, the OR circuit 54-2 output a logical sum of a pass or fail signal output from the AND circuit 46-2 and a pass or fail signal output from the AND circuit 48-2.

Then, the first counter 62 counts the number of times of passes or fails output from the OR circuit 54-1. In the present example, the first counter 62 receives the signal output from the OR circuit 54-1 via the exclusive OR circuit 55-1 and the AND circuit 57-1. For example, when you want to count the number of times of fails output from the OR circuit 54-1 as shown in FIGS. 3A and 3B, the exclusive OR circuit 55-1 receives "zero" as a mode signal and outputs an exclusive OR of this mode signal and the signal output from the OR circuit 54-1. Then, the AND circuit 57-1 outputs a logical product of the signal received from the exclusive OR circuit 55-1 and the control signal (CPE1) to the first counter 62. As described in reference to FIG. 2 and FIGS. 3A and 3B, the first counter 62 counts the number of times of the passes or fails for each phase of the first strobe signal. When counting passes "one" is input as a mode signal and counting is performed by a similar operation. Moreover, it is preferable that the measuring apparatus controlling section 92 resets the first counter 62 whenever the phase of the first strobe signal is shifted.

Moreover, the second counter 64 counts the number of times of passes or fails output from the OR circuit 54-2. Similarly to the first counter 62, the second counter 64 receives the signal output from the OR circuit 54-2 via the exclusive OR circuit 55-2 and the AND circuit 57-2. For example, the exclusive OR circuit 55-2 receives "zero" as a mode signal when you want to count the number of times of fails output from the OR circuit 54-2, and receives "one" as a mode signal when you want to count passes. Then, the exclusive OR circuit 55-2 outputs an exclusive OR of the received mode signal and the signal output from the OR circuit 54-2. The AND circuit 57-2 outputs a logical product of the signal received from the exclusive OR circuit 55-2 and the control signal (CPE2) to the second counter 64. The second counter 64 counts the number of times of the passes or fails for each phase of the second strobe signal. It is preferable that the measuring apparatus controlling section 92 resets the second counter 64 whenever the phase of the second strobe signal is shifted.

The fail memory 72 stores the number of times counted by the first counter 62 for each phase of the first strobe signal as shown in FIG. 3A, and stores the number of times counted by the second counter 64 for each phase of the second strobe signal as shown in FIG. 3B. The arithmetic section 73 computes a phase of a variation point of a waveform of an output signal, a jitter amount, and distribution of jitter based on data stored on the fail memory 72. The arithmetic section 73 may be a computer provided in an outside. Moreover, the arithmetic section 73 may decide the good or bad of the electronic device 200, based on a phase of a variation point of a waveform of an output signal, a jitter amount, and distribution of jitter that have been computed from the arithmetic section.

Moreover, the fail memory 72 may store a pass or fail signal output from the OR circuit 54-1 and a pass or fail signal output from the OR circuit 54-2. The selecting section 68 selects which of the counted results by the first counter 62 and the second counter 64 or the signals output from the OR circuits 54-1 and 54-2 are stored on the fail memory 72. It is preferable that a selection setting signal determining which is selected is supplied to the selecting section 68. The memory section 60 may further have a register for setting this selection setting signal before measuring a waveform of an output signal.

When the selection setting signal is a signal to store the counted results by the first counter 62 and the second counter 64 on the fail memory 72, the selecting section 68 acquires the counted results by the first counter 62 and the second counter 64 and stores the results on the fail memory 72. The timing at which the selecting section 68 acquires the counted results by the first counter 62 and the second counter 64 may be the timing at which the measuring apparatus controlling section 92 resets the first counter 62 and the second counter 64. In the present example, the measuring apparatus controlling section 92 generates an MST signal resetting the first counter 62 and the second counter 64, and supplies the MST signal to the selecting section 68, whenever the electronic device 200 outputs the output signal by predetermined multiple times. The selecting section 68 acquires the counted results by the first counter 62 and the second counter 64 at the timing based on the MST signal.

Moreover, when the selection setting signal is a signal to store the signals output from the OR circuits 54-1 and 54-2 on the fail memory 72, the selecting section 68 stores a pass or fail signal output from the OR circuit 54-1 and a pass or fail signal output from the OR circuit 54-2 on the fail memory. At this time, it is preferable that the measuring apparatus controlling section 92 supplies a STORE signal permitting the storage of this signal to the selecting section 68.

Moreover, the OR circuit 56 outputs a logical sum of the pass or fail signal output from the OR circuit 54-1 and the pass or fail signal output from the OR circuit 54-2 to the measuring apparatus controlling section 92. When the signal output from the OR circuit 56 shows a fail, the measuring apparatus controlling section 92 stores fail information on the fail memories 72 in all the memory sections 60 provided corresponding to other pins. In this case, since there is caused a difference between a time for which a signal is transmitted from the OR circuit 54-1 or the like to the selecting section 68 and a time for which a signal is transmitted from the OR circuit 56 to the measuring apparatus controlling section 92 and a control signal is transmitted from the measuring apparatus controlling section 92 to each of the selecting sections 68, it is preferable that the selecting section 68 receives a signal from the OR circuit 54-1 or the like via a delay circuit in order to adjust this difference.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

For example, in FIG. 1, the measuring apparatus 100 is provided in the test apparatus 300. However, in another example, the measuring apparatus 100 can function alone. In this case, the measuring apparatus 100 is provided with the measuring apparatus controlling section 92.

As apparent from the above descriptions, according to the present invention, it is possible to measure a variation point of a waveform of an output signal, a jitter amount, and distribution of jitter by one-time test.

What is claimed is:

1. A measuring apparatus that measures a waveform of an output signal output from an electronic device, comprising:

a strobe generating section that generates a first strobe signal and a second strobe signal having a phase different from that of the first strobe signal in synchronization with the output signal;

a strobe shifting section that sequentially changes a phase of the first strobe signal and a phase of the second strobe signal whenever the electronic device outputs the output signal multiple times;

a first timing comparing section that acquires a signal level of the output signal at each phase of the first strobe signal by the multiple times;

a second timing comparing section that acquires a signal level of the output signal at each phase of the second strobe signal by the multiple times;

a first counter that counts the number of times by which the signal level of each output signal acquired by said first timing comparing section is a High level for each phase of the first strobe signal;

a second counter that counts the number of times by which the signal level of each output signal acquired by said second timing comparing section is a Low level for each phase of the second strobe signal; and a fail memory that stores the number of times counted by said first counter and the number of times counted by said second counter.

2. The measuring apparatus as claimed in claim 1, further comprising an arithmetic section that computes a phase of a variation point of a waveform of the output signal, a jitter amount, and distribution of jitter based on the number of times counted by said first counter for each phase and the number of times counted by said second counter for each phase.

3. The measuring apparatus as claimed in claim 2, wherein said strobe shifting section sequentially changes a phase of the first strobe signal and a phase of the second strobe signal so that a relative phase between the first strobe signal and the second strobe signal is changed.

4. The measuring apparatus as claimed in claim 3, wherein
said strobe shifting section:
sequentially changes a phase of the first strobe signal from one end of a phase range including a phase of a variation point of a waveform of the output signal toward the other end of the phase range; and
sequentially changes a phase of the second strobe signal from the other end of the phase range toward one end of the phase range.

5. The measuring apparatus as claimed in claim 4, wherein said strobe shifting section sequentially changes a phase of the first strobe signal and a phase of the second strobe signal with the generally same change amount.

6. The measuring apparatus as claimed in claim 5, wherein said strobe shifting section stops the change of phases of the first strobe signal and the second strobe signal when the number of times by which the signal level of the output signal sequentially counted at each phase of the first strobe signal is not a High level is equal to the multiple times and the number of times by which the signal level of the output signal sequentially counted at each phase of the second strobe signal is not a Low level is equal to the multiple times.

7. The measuring apparatus as claimed in claim 1, further comprising a measuring apparatus controlling section that stores values counted by said first counter and said second counter on said fail memory in association with the phase of the first strobe and the phase of the second strobe and resets the values counted by said first counter and said second counter, whenever the electronic device outputs the output signal by the multiple times.

8. A measuring method for measuring a waveform of an output signal output from an electronic device, comprising:
a strobe generating step of generating a first strobe signal and a second strobe signal having a phase different from that of the first strobe signal in synchronization with the output signal;
a strobe shifting step of sequentially changing a phase of the first strobe signal and a phase of the second strobe signal whenever the electronic device outputs the output signal multiple times;
a first timing comparing step of acquiring a signal level of the output signal at each phase of the first strobe signal by the multiple times;
a second timing comparing step of acquiring a signal level of the output signal at each phase of the second strobe signal by the multiple times;
a first counting step of counting the number of times by which the signal level of each output signal acquired in said first timing comparing step is a High level for each phase of the first strobe signal;
a second counting step of counting the number of times by which the signal level of each output signal acquired in said second timing comparing step is a Low level for each phase of the second strobe signal; and
a storing step of storing the number of times counted in said first counting step and the number of times counted in said second counting step.

9. The measuring method as claimed in claim 8, further comprising an arithmetic step of computing a phase of a variation point of a waveform of the output signal, a jitter amount, and distribution of jitter based on the number of times counted in said first counting step for each phase and the number of times counted in said second counting step for each phase.

10. The measuring method as claimed in claim 9, wherein said strobe shifting step comprises sequentially changing a phase of the first strobe signal and a phase of the second strobe signal so that a relative phase between the first strobe signal and the second strobe signal is changed.

11. The measuring method as claimed in claim 10, wherein
said strobe shifting step comprises:
sequentially changing a phase of the first strobe signal from one end of a phase range including a phase of a variation point of a waveform of the output signal toward the other end of the phase range; and
sequentially changing a phase of the second strobe signal from the other end of the phase range toward one end of the phase range.

12. The measuring method as claimed in claim 11, wherein said strobe shifting step comprises sequentially changing a phase of the first strobe signal and a phase of the second strobe signal with the generally same change amount.

13. A test apparatus that tests an electronic device, comprising:
a control section that generates a test signal for testing the electronic device and supplies the test signal to the electronic device; and
a measuring apparatus that measures a waveform of an output signal from the electronic device and decides the good or bad of the electronic device, and
the measuring apparatus comprising:

a strobe generating section that generates a first strobe signal and a second strobe signal having a phase different from that of the first strobe signal in synchronization with the output signal;

a strobe shifting section that sequentially changes a phase of the first strobe signal and a phase of the second strobe signal whenever the electronic device outputs the output signal multiple times;

a first timing comparing section that acquires a signal level of the output signal at each phase of the first strobe signal by the multiple times;

a second timing comparing section that acquires a signal level of the output signal at each phase of the second strobe signal by the multiple times;

a first counter that counts the number of times by which the signal level of each output signal acquired by said first timing comparing section is a High level for each phase of the first strobe signal;

a second counter that counts the number of times by which the signal level of each output signal acquired by said second timing comparing section is a Low level for each phase of the second strobe signal;

a fail memory that stores the number of times counted by said first counter and the number of times counted by said second counter; and an arithmetic section that computes a phase of a variation point of a waveform of the output signal, a jitter amount, and distribution of jitter and decides the good or bad of the electronic device based on the number of times counted by said first counter for each phase and the number of times counted by said second counter for each phase.

* * * * *